(12) United States Patent  (10) Patent No.: US 8,026,520 B2
Lee et al.  (45) Date of Patent: Sep. 27, 2011

(54) THIN FILM TRANSISTOR, METHOD OF FABRICATING THE SAME, AND ORGANIC LIGHT EMITTING DIODE DISPLAY DEVICE HAVING THE THIN FILM TRANSISTOR

(75) Inventors: Dong-kyu Lee, Suwon-si (KR); Mu-hyun Kim, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 154 days.

(21) Appl. No.: 12/393,473

(22) Filed: Feb. 26, 2009

(65) Prior Publication Data

US 2010/0090224 A1  Apr. 15, 2010

(30) Foreign Application Priority Data

Oct. 15, 2008 (KR) .................. 10-2008-0101195

(51) Int. Cl.
*H01L 29/10* (2006.01)
*H01L 21/00* (2006.01)

(52) U.S. Cl. ............... 257/66; 257/72; 257/E29.273; 257/E21.414; 438/149; 438/151

(58) Field of Classification Search ............ 257/66, 257/72, E21.411, E21.414, E29.273, E33.053, 257/E51.028; 438/151, 158, 149, 780
See application file for complete search history.

(56) References Cited

U.S. PATENT DOCUMENTS

| 6,400,489 | B1 | 6/2002 | Suzuki et al. | |
|---|---|---|---|---|
| 6,593,688 | B2 | 7/2003 | Park et al. | |
| 2002/0041151 | A1 | 4/2002 | Park et al. | |
| 2002/0068390 | A1* | 6/2002 | Gosain et al. | 438/149 |
| 2003/0127974 | A1* | 7/2003 | Miyazawa | 313/504 |
| 2003/0211359 | A1 | 11/2003 | Park et al. | |
| 2003/0219549 | A1* | 11/2003 | Shimizu | 428/1.1 |
| 2004/0004224 | A1* | 1/2004 | Han | 257/88 |
| 2004/0087696 | A1* | 5/2004 | Gohil | 524/404 |

(Continued)

FOREIGN PATENT DOCUMENTS

JP  2001-21850  1/2001

(Continued)

OTHER PUBLICATIONS

Abstract of WO/2002/100936 published on Dec. 19, 2002.

(Continued)

*Primary Examiner* — Matthew Landau
*Assistant Examiner* — Latanya N Crawford
(74) *Attorney, Agent, or Firm* — H.C. Park & Associates, PLC

(57) ABSTRACT

A thin film transistor (TFT), a method of fabricating the same, and an organic light emitting diode (OLED) display device having the TFT, the TFT includes a substrate, a protection layer disposed on the substrate, a buffer layer disposed on the protection layer, a semiconductor layer disposed on the buffer layer, a gate electrode disposed on the semiconductor layer, a gate insulating layer to electrically insulate the semiconductor layer from the gate electrode, and source and drain electrodes electrically insulated from the gate electrode and connected to the semiconductor layer. The protection layer is formed of an amine-containing clay. The OLED includes the TFT, an insulating layer disposed on the TFT, a first electrode connected to the drain electrode of the TFT, an organic layer disposed on the first electrode, and a second electrode disposed on the organic layer.

10 Claims, 5 Drawing Sheets

U.S. PATENT DOCUMENTS

| | | | |
|---|---|---|---|
| 2005/0080180 A1* | 4/2005 | Lin et al. | 524/445 |
| 2005/0153476 A1* | 7/2005 | Park et al. | 438/98 |
| 2005/0157367 A1* | 7/2005 | Miyazawa | 359/245 |
| 2005/0170210 A1 | 8/2005 | Kim et al. | |
| 2006/0220056 A1* | 10/2006 | Lee | 257/100 |
| 2007/0207298 A1* | 9/2007 | Suzuki et al. | 428/216 |
| 2008/0102227 A1 | 5/2008 | Bae | |

FOREIGN PATENT DOCUMENTS

| | | |
|---|---|---|
| JP | 2004-530035 | 9/2004 |
| KR | 2001-95437 | 11/2001 |
| KR | 2005-111823 | 11/2005 |
| KR | 10-2005-0113040 | 12/2005 |
| KR | 10-2005-0113360 | 12/2005 |
| KR | 10-553758 | 2/2006 |
| KR | 2007-50785 | 5/2007 |
| KR | 10-0759681 | 9/2007 |
| WO | WO 01/72925 A1 | 10/2001 |

OTHER PUBLICATIONS

Abstract of 2005/78763 published Aug. 8, 2005.
Ebina, Takeo et al. *Flexible Transparent Clay Films with Heat-Resistant and High Gas-Barrier Properties*. Adv. Mater.2007, 19, 2450-2453; DOI: 10.1002/adma.200700162.

* cited by examiner

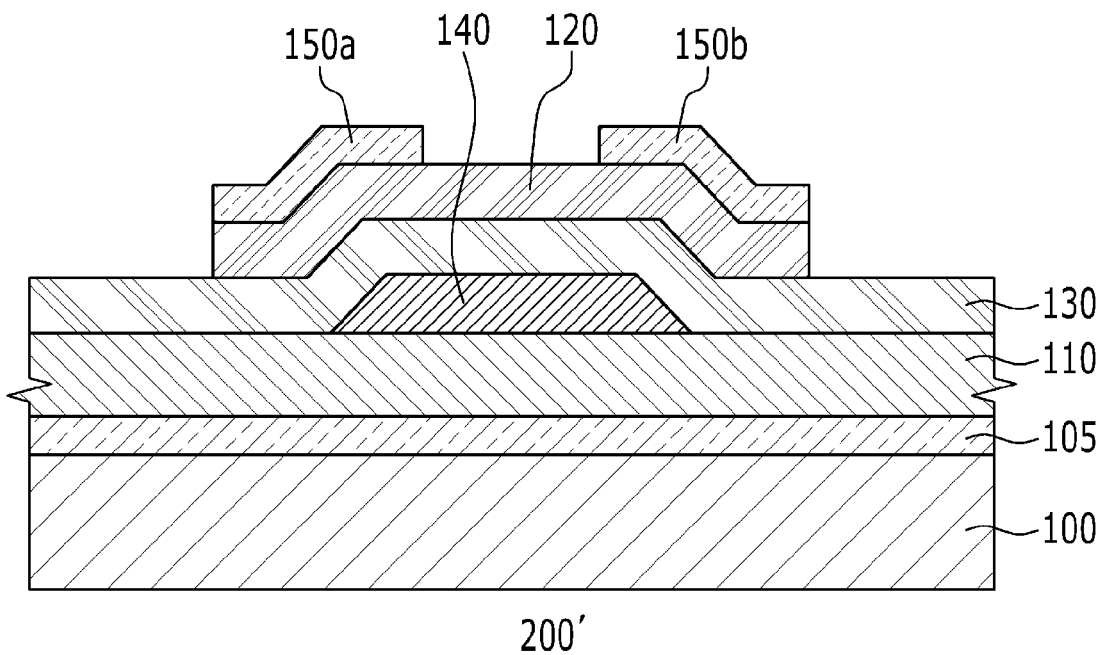

THIN FILM TRANSISTOR, METHOD OF FABRICATING THE SAME, AND ORGANIC LIGHT EMITTING DIODE DISPLAY DEVICE HAVING THE THIN FILM TRANSISTOR

CROSS-REFERENCE TO RELATED APPLICATIONS

This application claims the benefit of Korean Patent Application No. 2008-101195, filed Oct. 15, 2008, in the Korean Intellectual Property Office, the disclosure of which is hereby incorporated herein by reference.

BACKGROUND OF THE INVENTION

1. Field of the Invention

Aspects of the present invention relate to a thin film transistor (TFT), a method of fabricating the same, and an organic light emitting diode (OLED) display device having the TFT.

2. Description of the Related Art

In general, an OLED display device is a self-emissive display that has a fast response speed of 1 ms, or less, a low power consumption, and a wide viewing angle. Also, an OLED display device can be fabricated using a simple, low-temperature process that is based on conventional semiconductor manufacturing technology. For these reasons, OLED display devices have attracted much attention as the next generation of flat-panel displays (FPD).

However, an OLED display device may be degraded, due to exposure to moisture and/or oxygen. Also, impurities may diffuse from a substrate into components of an OLED display device, thereby degrading the elements. Therefore, there is a need for a new technique to prevent the diffusion of moisture, oxygen, and/or impurities into elements of OLED display devices.

SUMMARY OF THE INVENTION

Aspects of the present invention provide: a thin film transistor (TFT) that is resistant to the diffusion of impurities from a substrate thereof, into the TFT, to prevent the degradation of the TFT; a method of fabricating the TFT; and an organic light emitting diode (OLED) display device having the TFT.

According to an aspect of the present invention, provided is a TFT that includes: a substrate; a protection layer disposed on the substrate; a buffer layer disposed on the protection layer; a semiconductor layer disposed on the buffer layer; a gate electrode disposed on the semiconductor layer; a gate insulating layer to electrically insulate the semiconductor layer from the gate electrode; and source and drain electrodes that are electrically insulated from the gate electrode and connected to the semiconductor layer. In the TFT, the protection layer is formed of an amine-containing clay.

According to another aspect of the present invention, a method of fabricating the above-described TFT is provided.

According to yet another aspect of the present invention, provided is an OLED display that includes: a substrate; a protection layer disposed on the substrate; a buffer layer disposed on the protection layer; a semiconductor layer disposed on the buffer layer; a gate electrode disposed on the semiconductor layer; a gate insulating layer to electrically insulate the semiconductor layer from the gate electrode; source and drain electrodes that are electrically insulated from the gate electrode and connected to the semiconductor layer; an insulating layer disposed over the entire surface of the substrate; and a first electrode, an organic layer, and a second electrode, which are electrically connected to the source and drain electrodes. In the OLED display, the protection layer is formed of an amine-containing clay.

Additional aspects and/or advantages of the present invention will be set forth in part in the description which follows and, in part, will be obvious from the description, or may be learned by practice of the present invention.

BRIEF DESCRIPTION OF THE DRAWINGS

These and/or other aspects and advantages of the invention will become apparent and more readily appreciated from the following description of the exemplary embodiments, taken in conjunction with the accompanying drawings of which:

FIG. 5 is a cross-sectional view of a TFT 200', according to a second exemplary embodiment of the present invention.

DETAILED DESCRIPTION OF THE EXEMPLARY EMBODIMENTS

Figure 1A:
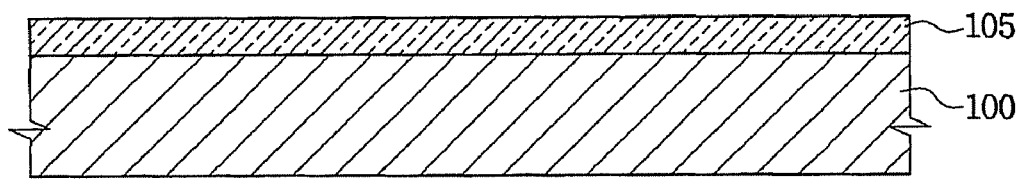
FIGS. 1A through 1D are cross-sectional views of a thin film transistor (TFT), according to an exemplary embodiment of the present invention.

Reference will now be made in detail to the exemplary embodiments of the present invention, examples of which are illustrated in the accompanying drawings, wherein like reference numerals refer to the like elements throughout. The exemplary embodiments are described below, in order to explain the aspects of the present invention, by referring to the figures.

As referred to herein, when a first element is said to be disposed or formed "on", or "adjacent to", a second element, the first element can directly contact the second element, or can be separated from the second element by one or more other elements located therebetween. In contrast, when an element is referred to as being disposed or formed "directly on" another element, there are no intervening elements present. As used herein, the term "and/or" includes any and all combinations of one or more of the associated items.

FIGS. 1A through 1D are cross-sectional views of components of a thin film transistor (TFT) 200, according to an exemplary embodiment of the present invention. Referring to FIG. 1A, a substrate 100 may be provided. The substrate 100 may be a transparent insulating substrate, such as a glass substrate or a plastic substrate.

Thereafter, a protection layer 105 may be formed on the substrate 100. The protection layer 105 may be formed using a clay. The clay can include plate-shaped silicate particles, which can be disposed in layers. The clay may include at least one of the following materials: montmorillonite, hectorite, saponite, fluorohectorite, and laponite. The size of the particles may be in the range of nanometers. For example, the clay can have a grain size of about 1 to 10 µm. The protection layer may include a polymer and the clay.

In order to form the protection layer 105 on the substrate 100, the clay is dispersed in water, with an organic amine compound, such as an ammonium salt. The clay reacts with the amine compound, such that positive metal ions in the clay, such as $Na^+$ ions, $K^+$ ions, and/or $Mg^+$ ions, are replaced by an organic ammonium salt. During the formation of the protection layer 105 the plate-shaped particles are exfoliated. Thus, the grain structure of the protection layer can be referred to as being irregular. Due to the structure of the protection layer 105, the protection layer 105 can have a reduced high heat resistance and gas permeability. Therefore, protection layer 105 can have a reduced thickness, and/or the amount of the clay included in the protection layer 105 can be reduced. In addition, the positive metal ions of the clay are replaced by the organic ammonium salt and captured between the plate-shaped particles, thereby effectively preventing the diffusion of the positive metal ions through the protection layer 105.

Figure 3:
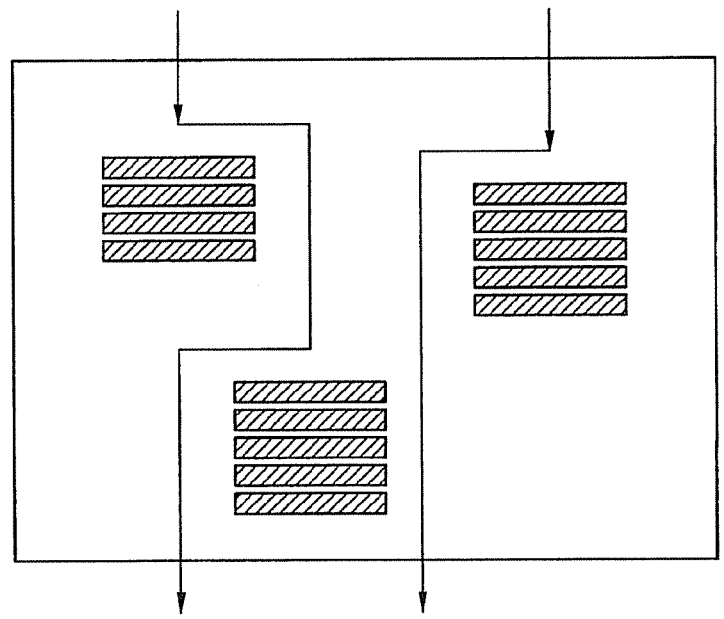
FIG. 3 is a diagram of conventional clay.
Figure 4:
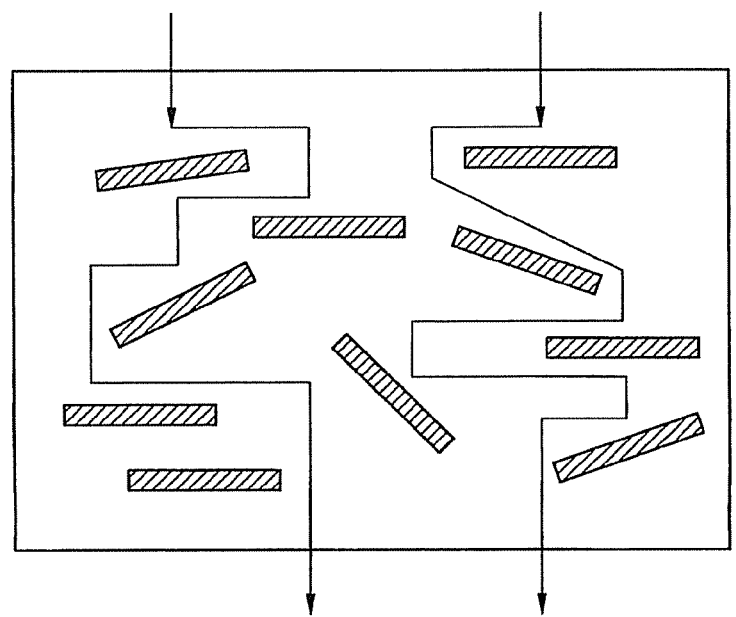
FIG. 4 is a diagram of clay according to an exemplary embodiment of the present invention.

FIG. 3 is a diagram of conventional clay having plate-shaped grains that have a regular, stacked, grain structure, and FIG. 4 is a diagram of clay with an irregular grain structure, according to an exemplary embodiment of the present invention. Since the clay of FIG. 3 has the stacked grain structure, gases, and/or impurities may more easily pass through the clay, by moving around stacks of the plate-shaped particles, as compared to the clay of FIG. 4. Therefore, the clay of FIG. 4 more effectively prevents the diffusion of impurities there through.

Referring again to FIG. 1A, the protection layer 105 may be obtained by coating the clay dispersion on the substrate 100, using a contact printing process, a noncontact printing process, a bar coating process, or a spin coating process. Thus, the thickness of the protection layer 105 is not particularly limited, so long as the clay completely coats a surface of the substrate 100.

Figure 1B:
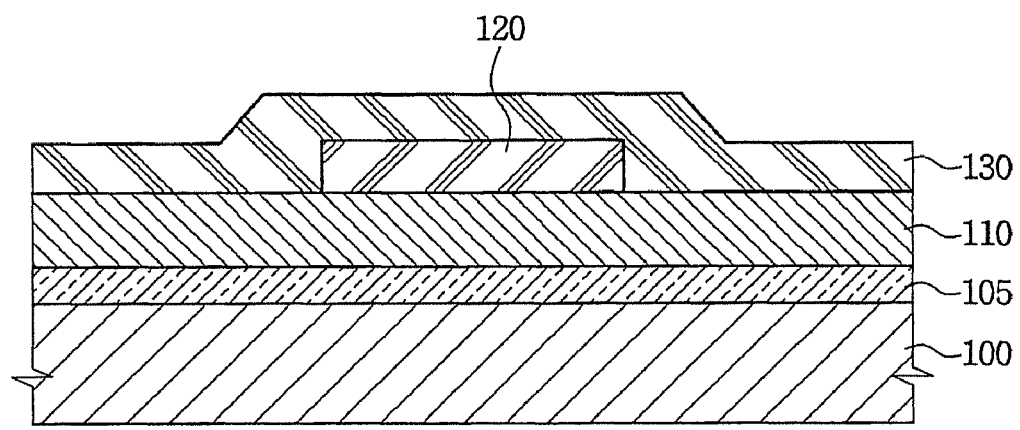

Referring to FIG. 1B, a buffer layer 110 may be formed on the protection layer 105. Thereafter, a semiconductor layer 120, which may be formed of polycrystalline silicon, may be formed on the buffer layer 110. A gate insulating layer 130 may be formed on the buffer layer 110 and the semiconductor layer 120. The buffer layer 110 may be formed of a silicon oxide, a silicon nitride, or layers thereof. The gate insulating layer 130 may be formed of a silicon nitride, a silicon oxide, or layers thereof.

Figure 1C:
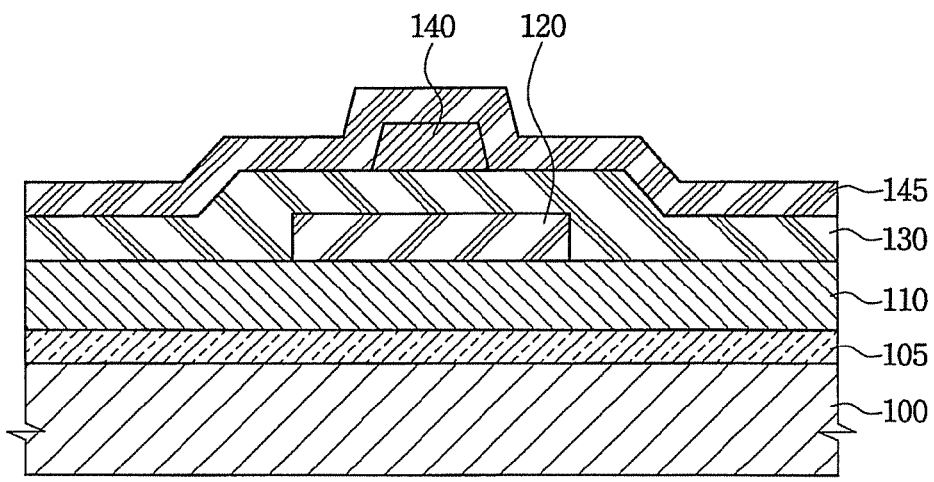

Referring to FIG. 1C, a gate electrode 140 may be formed on the gate insulating layer 130, in a position corresponding to the semiconductor layer 120. An interlayer insulating layer 145 may be formed on the gate insulating layer 130 and the gate electrode 140. The gate electrode 140 may be formed of one selected from the group consisting of aluminum (Al), an Al alloy, molybdenum (Mo), and an Mo alloy. For example, the gate electrode 140 may be formed of a molybdenum-tungsten (MoW) alloy. The interlayer insulating layer 145 may be formed of a silicon nitride, a silicon oxide, or layers thereof.

Figure 1D:
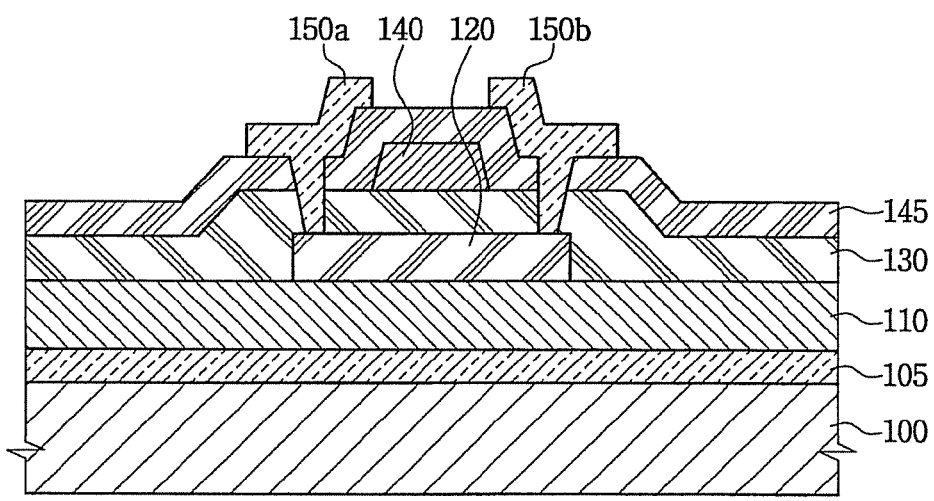

Referring to FIG. 1D, source and drain electrodes 150a and 150b may be formed on the interlayer insulating layer 145 and connected to portions of the semiconductor layer 120. As a result, the fabrication of a TFT 200 is completed.

Figure 2:
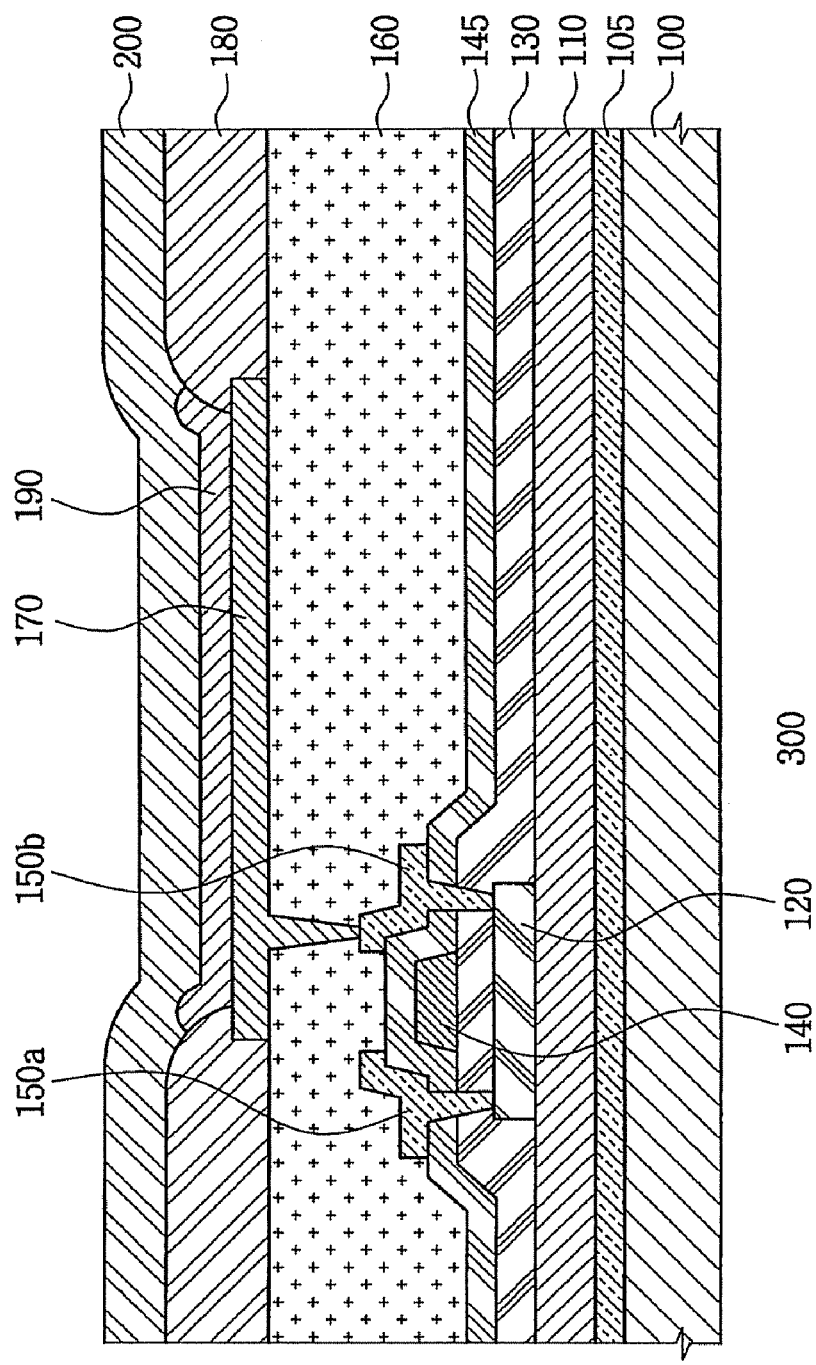
FIG. 2 is a cross-sectional view of an organic light emitting diode (OLED), according to an exemplary embodiment of the present invention.

FIG. 2 is a cross-sectional view of an organic light emitting diode (OLED) display 300, according to an exemplary embodiment of the present invention. The OLED display 300 includes the TFT 200.

Referring to FIG. 2, the TFT 200, which includes the substrate 100, the semiconductor layer 120, the gate electrode 140, and the source and drain electrodes 150a and 150b, is coated with an insulating layer 160. Thereafter, a first electrode 170 may be formed on the insulating layer 160 and connected to portions of the source and drain electrodes 150a and 150b. A pixel defining layer 180 may be formed around the first electrode 170. Afterwards, an organic layer 190 may be formed on the first electrode 170. A second electrode 200 may be formed on the pixel defining layer 180 and the organic layer 190, to complete the OLDE display 300.

FIG. 5 is a cross-sectional view of a TFT 200', according to a second exemplary embodiment of the present invention. The TFT 200' is similar to the TFT 200 of FIG. 1D, except it has a bottom gate structure.

Although the exemplary embodiments of the present invention describe top-gate TFTs, the aspects of the present invention may be also applied to bottom-gate TFTs. According to aspects of the present invention, provided is a TFT having a protection layer that prevents the diffusion of positive metal ions and/or impurities from a substrate, into other elements of the TFT, thereby inhibiting the degradation of the TFT.

Although a few exemplary embodiments of the present invention have been shown and described, it would be appreciated by those skilled in the art that changes may be made in these exemplary embodiments, without departing from the principles and spirit of the invention, the scope of which is defined in the claims and their equivalents.

What is claimed is:

1. A thin film transistor (TFT) comprising:
   a substrate;
   a protection layer disposed on the substrate and comprising an amine-containing clay and an organic ammonium salt;
   a buffer layer disposed on the protection layer;
   a semiconductor layer disposed on the buffer layer;
   a gate electrode disposed on the semiconductor layer;
   a gate insulating layer to electrically insulate the semiconductor layer from the gate electrode; and
   source and drain electrodes that are electrically insulated from the gate electrode and connected to the semiconductor layer,
   wherein the clay has plate-shaped particles that are exfoliated and irregularly dispersed within the protection layer.

2. The TFT according to claim 1, wherein the protection layer further comprises a polymer.

3. The TFT according to claim 1, wherein the substrate comprises a glass or a plastic.

4. A method of fabricating a thin film transistor (TFT), comprising:
   forming a protection layer comprising an amine-containing clay, on a substrate;
   forming a buffer layer on the protection layer;
   forming a semiconductor layer on the buffer layer;
   forming a gate insulating layer on the semiconductor layer and the buffer layer;
   forming a gate electrode on the gate insulating layer, in a position corresponding to the semiconductor layer;
   forming an interlayer insulating layer on the gate insulating layer and the gate electrode; and
   forming source and drain electrodes on the interlayer insulating layer, which are electrically connected to the semiconductor layer,
   wherein the clay has plate-shaped particles that are exfoliated and irregularly dispersed within the protection layer, and
   wherein the protection layer is formed by reacting a clay with an organic amine compound, such that positive metal ions in the clay are replaced by an organic ammonium salt.

5. The method according to claim 4, wherein the protection layer is formed using one selected from the group consisting of a contact printing process, a noncontact printing process, a bar coating process, and a spin coating process.

6. The method according to claim 4, wherein the forming of the protection layer comprises:
   mixing a clay and an organic amine compound in water, to create a slurry; and
   coating the substrate with the slurry, using a contact printing process, a noncontact printing process, a bar coating process, or a spin coating process.

7. A method of fabricating a thin film transistor (TFT), comprising:
   forming a protection layer comprising an amine-containing clay, on a substrate;
   forming a buffer layer on the protection layer;
   forming a gate electrode on the buffer layer;
   forming a gate insulating layer on the gate electrode;
   forming a semiconductor layer on the gate insulating layer, in a position corresponding to the gate electrode; and
   forming source and drain electrodes on the semiconductor layer, which are electrically insulated from the gate electrode,
   wherein the clay has plate-shaped particles that are exfoliated and irregularly dispersed within the protection layer, and
   wherein the forming of the protection layer comprises reacting a clay that is dispersed in water, with an organic amine compound, such that positive metal ions in the clay are replaced by an organic ammonium salt.

8. An organic light emitting diode (OLED) display device comprising:
   a substrate;
   a protection layer disposed on the substrate and comprising an amine-containing clay and an organic ammonium salt;
   a buffer layer disposed on the protection layer;
   a semiconductor layer disposed on the buffer layer;
   a gate electrode disposed on the semiconductor layer;
   a gate insulating layer to electrically insulate the semiconductor layer from the gate electrode;
   source and drain electrodes that are electrically insulated from the gate electrode and connected to the semiconductor layer;
   an interlayer insulating layer disposed on the gate insulating layer and the gate electrode;
   a first electrode electrically connected to the drain electrode;
   an organic layer disposed on the first electrode; and
   a second electrode disposed on the organic layer,
   wherein the clay has plate-shaped particles that are exfoliated and irregularly dispersed within the protection layer.

9. The OLED display device of claim 8, wherein the protection layer further comprises a polymer.

10. The OLED display device of claim 8, wherein the substrate comprises a glass or a plastic.

* * * * *